US007652290B2

United States Patent
Lin

(10) Patent No.: US 7,652,290 B2
(45) Date of Patent: Jan. 26, 2010

(54) STANDBY CURRENT ERASION CIRCUIT OF DRAM

(75) Inventor: Yu-Chang Lin, Hsinchu Hsien (TW)

(73) Assignee: Winbond Electronics Corporation (TW)

( * ) Notice: Subject to any disclaimer, the term of this patent is extended or adjusted under 35 U.S.C. 154(b) by 1148 days.

(21) Appl. No.: 10/232,460

(22) Filed: Aug. 30, 2002

(65) Prior Publication Data

US 2003/0214851 A1 Nov. 20, 2003

(30) Foreign Application Priority Data

May 15, 2002 (TW) .............................. 91110309 A

(51) Int. Cl.
H01L 27/108 (2006.01)
G11C 29/04 (2006.01)
G11C 29/12 (2006.01)
G11C 29/50 (2006.01)
G11C 8/08 (2006.01)
G11C 8/10 (2006.01)
G11C 8/14 (2006.01)
G11C 7/12 (2006.01)
G11C 7/18 (2006.01)

(52) U.S. Cl. ..................... 257/68; 365/200; 365/230.06
(58) Field of Classification Search .................. 257/68, 257/905–908, 71, 297, E21.646, E27.075, 257/E27.084; 711/105; 365/200, 230.06
See application file for complete search history.

(56) References Cited

U.S. PATENT DOCUMENTS

| 5,499,211 | A | * | 3/1996 | Kirihata et al. | .............. 365/203 |
| 5,751,651 | A | * | 5/1998 | Ooishi | ........................ 365/226 |
| 5,995,423 | A | * | 11/1999 | Lakhani et al. | ............. 365/200 |
| 6,046,948 | A | * | 4/2000 | Zheng et al. | ................. 365/203 |
| 6,285,612 | B1 | * | 9/2001 | DeBrosse | .................... 365/205 |

* cited by examiner

Primary Examiner—Peter DungBa Vo
Assistant Examiner—Matthew D. Hoel
(74) Attorney, Agent, or Firm—Ladas and Parry LLP

(57) ABSTRACT

The present invention discloses a standby current erasion circuit applied in DRAM, which improves prior art word line driving circuit to have the word line voltage outputted in standby mode be equal to the bit line voltage, thereby the short DC standby current between the word line and bit line can be erased.

8 Claims, 6 Drawing Sheets

STANDBY CURRENT ERASION CIRCUIT OF DRAM

BACKGROUND OF THE INVENTION

1. Field of the Invention

The present invention relates to a circuit for erasing the leakage current of DRAM, more particularly to a circuit for erasing the short DC standby current between the bit lines and the word lines of DRAM.

2. Background of the Invention

In the manufacturing process of DRAM, a short circuit between the bit line and the word line sometimes occurs and causes a leakage current and affect the product yield.

One of the solutions for the above-mentioned problem is disclosed in U.S. Pat. No. 5,499,211, entitled "BIT-LINE PRE-CHARGE CURRENT LIMITER FOR CMOS DYNAMIC MEMORIES." As shown in FIG. 1, a conventional circuit 10 comprises a word line 12, a pair of complementary bit lines 13, a pre-charge equalization circuit 14 and a current-limiting means 11. In prior art, in order to prevent an excess leakage current caused by the short circuit between the bit line (BL) and the word line (WL), a current-limiting means 11, such as a depletion NMOS, is added between a source of pre-charge voltage (VBLEQ) 15 and the pair of complementary bit lines 13 so as to limit the maximum leakage current when the short circuit between the bit line and the word line occurs.

Generally, the word line voltage ($V_{WL}$) is 0 volt in the standby mode, such as the word line driving circuit 20 shown in FIG. 2(a). However, the bit line voltage is larger than 0 volt, so a leakage current path will be formed in the standby mode. The leakage current will flow from BLEQ, BL, and WL to the ground. FIG. 2(b) shows a timing diagram of FIG. 1 and FIG. 2(a). In other words, the conventional method cannot effectively erase the leakage current when the short circuit occurs between the bit lines and the word lines. For the current application in the product for low power DRAM, the leakage current is still too large to satisfy the market requirement.

Regarding the problems in the prior art, the present invention provides an innovative standby current erasion circuit for the DRAM to overcome the above-mentioned disadvantages.

SUMMARY OF THE INVENTION

The object of the present invention is to provide a standby current erasion circuit for DRAM, which is suitable for the application requirement in a low power DRAM.

To this end, the present invention discloses a standby current erasion circuit for DRAM, which improves prior art word line driving circuit to have the word line voltage output in standby mode be equal to the bit line voltage, thereby the short DC standby current between the word line and bit line can be erased.

The standby current erasion circuit for DRAM according to the present invention comprises a block detection circuit and a word line driving circuit. The block detection circuit is used to enable a short circuit control signal when a short circuit between the bit lines and word lines of the DRAM is detected. The word line driving circuit is connected to the block detection circuit, and sets a voltage level of the bit line occurring a short circuit as a voltage level of the corresponding word line occurring a short circuit in a standby mode if the short circuit control signal is enabled.

BRIEF DESCRIPTION OF THE DRAWINGS

The present invention will be described according to the appended drawings in which.

PREFERRED EMBODIMENT OF THE PRESENT INVENTION

Figure 1:
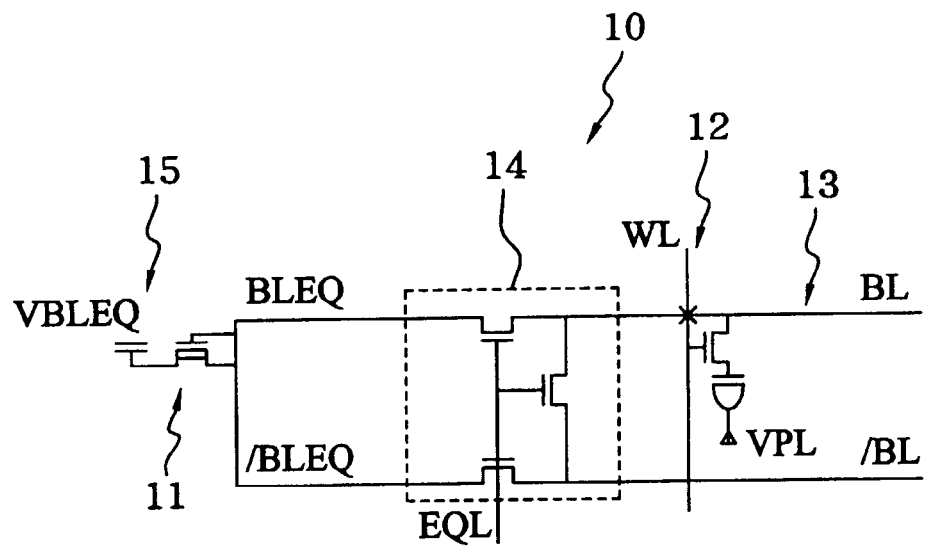
FIG. 1 shows a prior art standby current erasion circuit for DRAM.
Figure 2A:
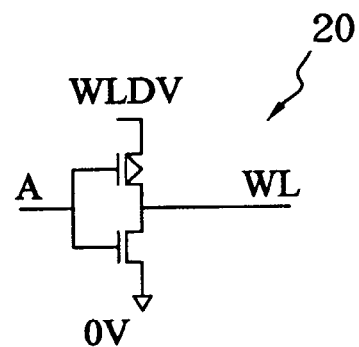
FIG. 2(a) shows a prior art word line driving circuit.
Figure 2B:
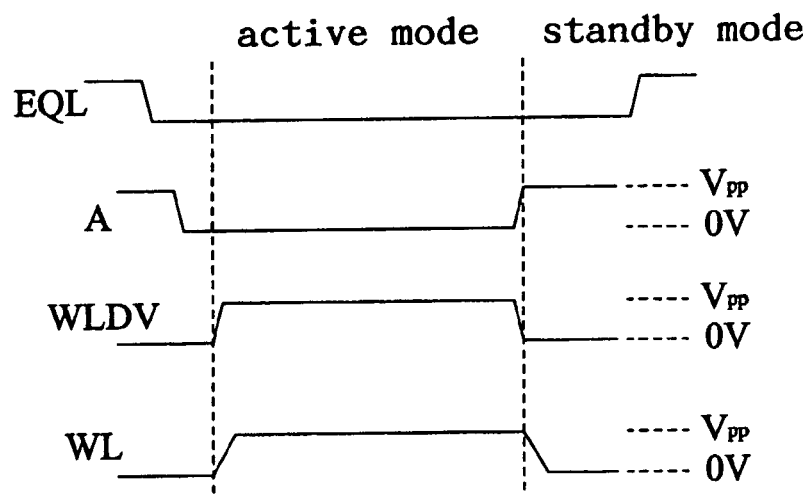
FIG. 2(b) shows a timing diagram of FIG. 1 and FIG. 2(a)

The standby current erasion circuit for DRAM according to the present invention can adopt a structure similar to FIG. 1. The detailed description is illustrated as follows.

Figure 3A:
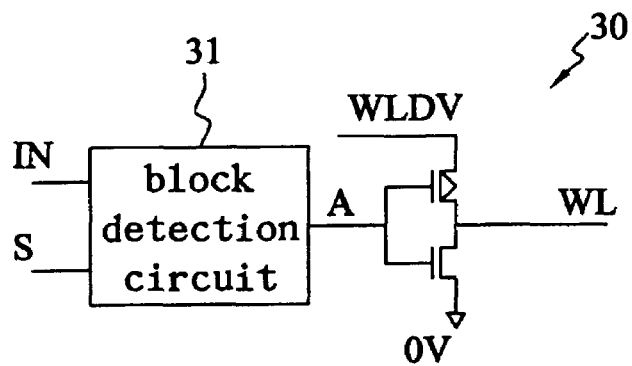
FIG. 3(a) shows an embodiment of the word line driving circuit according to the present invention.
Figure 3B:
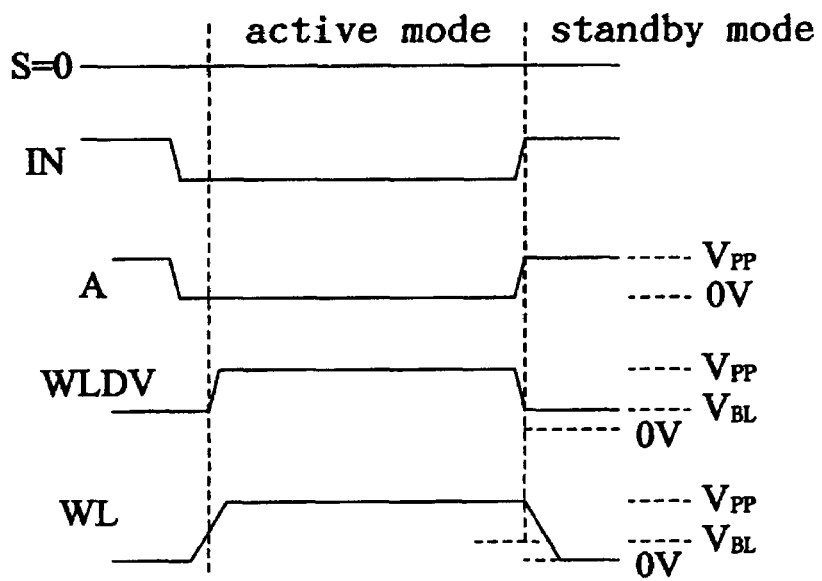
FIG. 3(b) shows a timing diagram of the invention if there is no short circuit between the word lines and the bit lines.
Figure 3C:
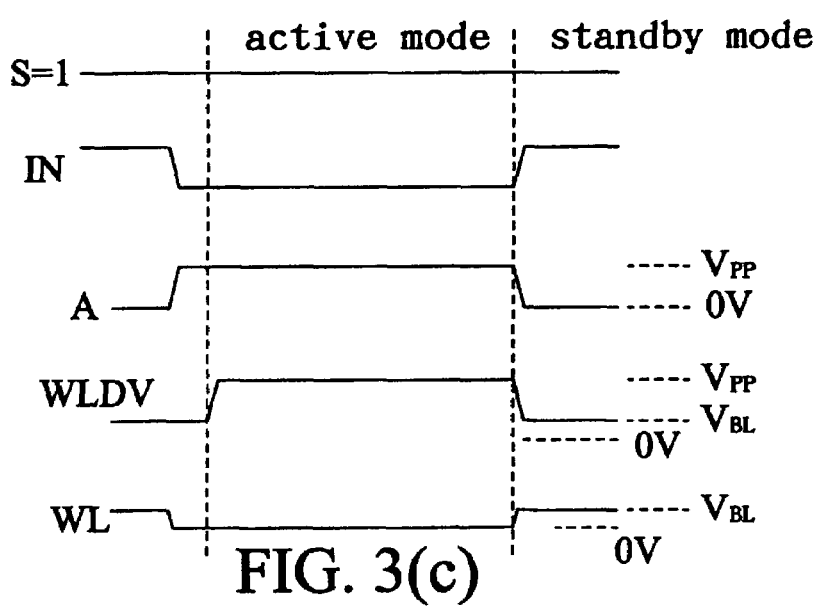
FIG. 3(c) shows a timing diagram of the invention if a short circuit occurs between the word lines and the bit lines.

FIG. 3(a) shows an embodiment of the word line driving circuit according to the present invention. This embodiment inserts a block detection circuit 31 in a front stage of prior art word line driving circuit (e.g., an inverter), and pulls up the word line driving voltage $V_{WL}$ from 0 V to the bit line voltage $V_{BL}$. FIG. 3(b) shows a timing diagram of the invention if there is no short circuit between the word lines and the bit lines, and FIG. 3(c) shows a timing diagram of the invention if a short circuit occurs between the word lines and the bit lines. When there is no short circuit between the bit lines and word lines, a selection line S is set to zero; or one, otherwise. The block detection circuit 31 functions like a decoder, and when the selection line S is zero, the output signal A is equal to the input signal IN. In other words, in this situation, the signal feeds through the block detection circuit 31. However, when the selection line S is one, the block detection circuit 31 inverts the input signal IN to obtain the output signal A. In other words, the output signal A functions as a short circuit control signal. By the circuit of the invention, a short DC standby current due to manufacturing flaws will be erased, and the requirements of low power DRAM products will be satisfied.

In addition, since the output voltage of the word line driving circuit occurring a short circuit in a standby mode is equal to the word line voltage, the leakage current due to a short circuit between the word lines and bit lines can be erased. In other words, the present invention can omit the current-limiting means 11 used in prior art and get a better performance.

Figure 4A:
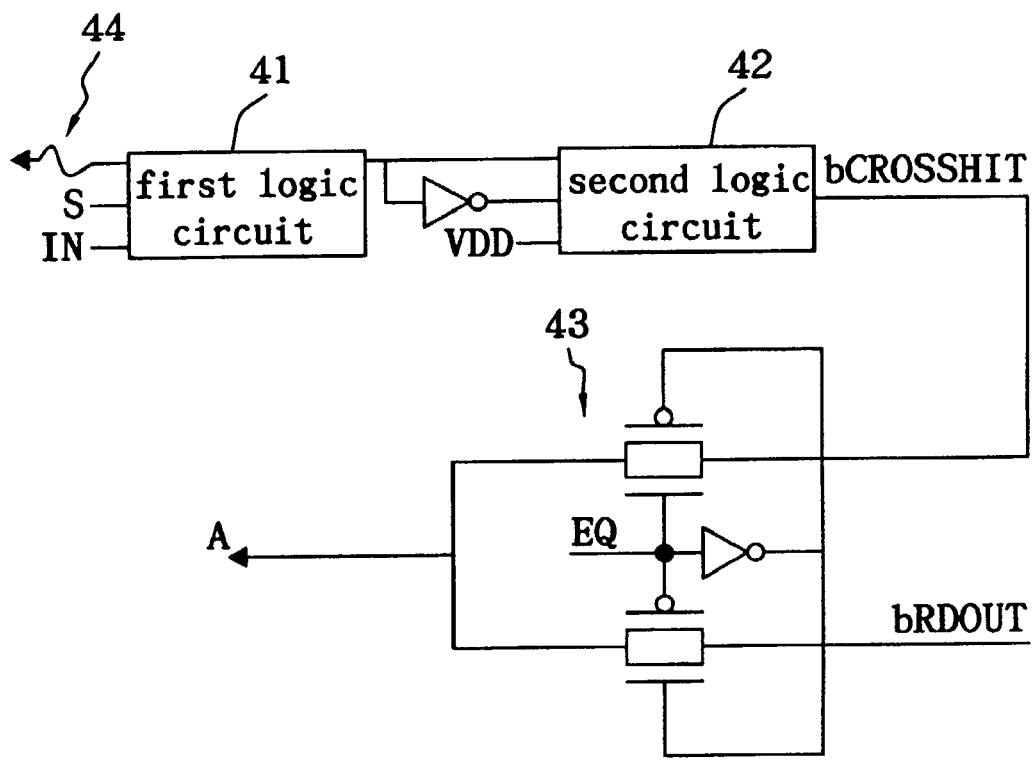
FIG. 4(a) shows an embodiment of the word line driving circuit of FIG. 3(a) according to the present invention.
Figure 4B:
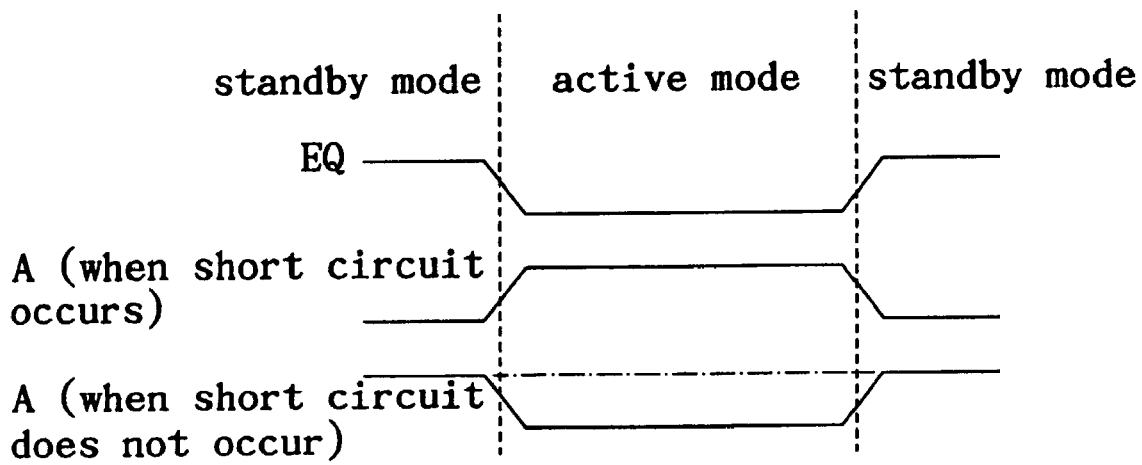
FIG. 4(b) shows a timing diagram of the word line driving circuit of FIG. 4(a)

FIG. 4(a) shows an embodiment of the word line driving circuit of FIG. 3(a) according to the present invention. By a first logic circuit 41, a second logic circuit 42, an inverter 43 and a fuse 44, the selection line S and the input signal IN can generate output signals A and WL, and the signal EQ serves as a control signal for shifting voltage level. FIG. 4(b) shows a timing diagram of the word line driving circuit of FIG. 4(a).

Figure 5A:
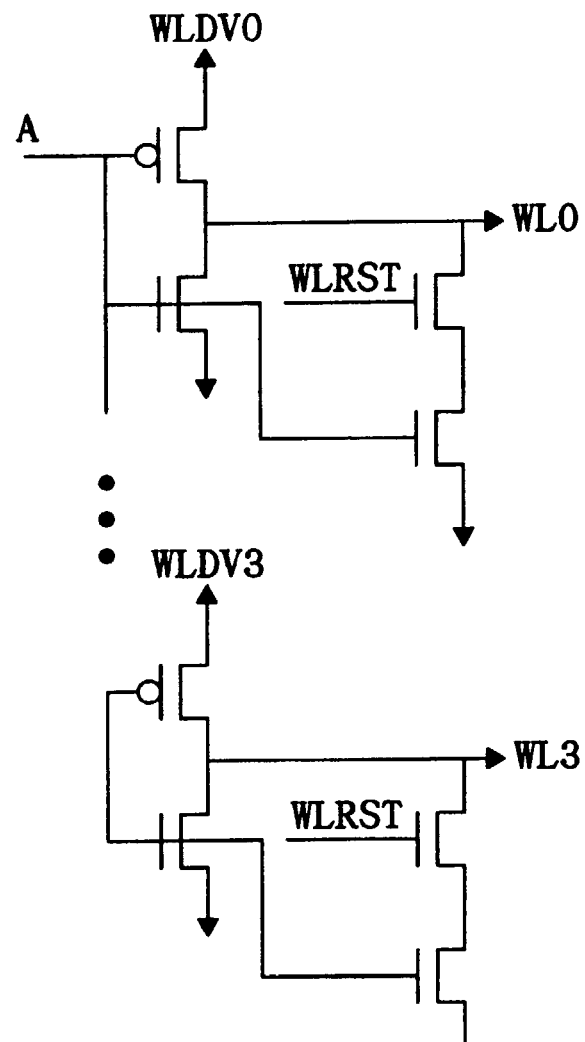
FIG. 5(a) shows an embodiment of the inverters of FIG. 4(a)
Figure 5B:
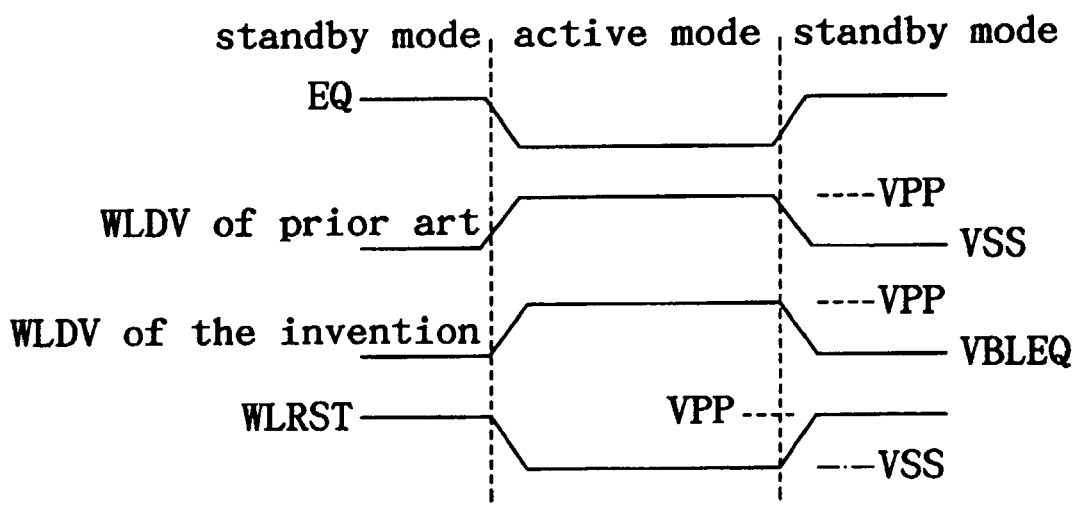
FIG. 5(b) shows a timing diagram of the structure in FIG. 5(a)

FIG. 5(a) shows an embodiment of the inverters 43 of FIG. 4(a). By the fuse 44 and spare circuits on columns and rows of the DRAM, the problem of short circuits between word lines and bit lines can be solved. FIG. 5(b) shows a timing diagram of the structure in FIG. 5(a).

Figure 6A:
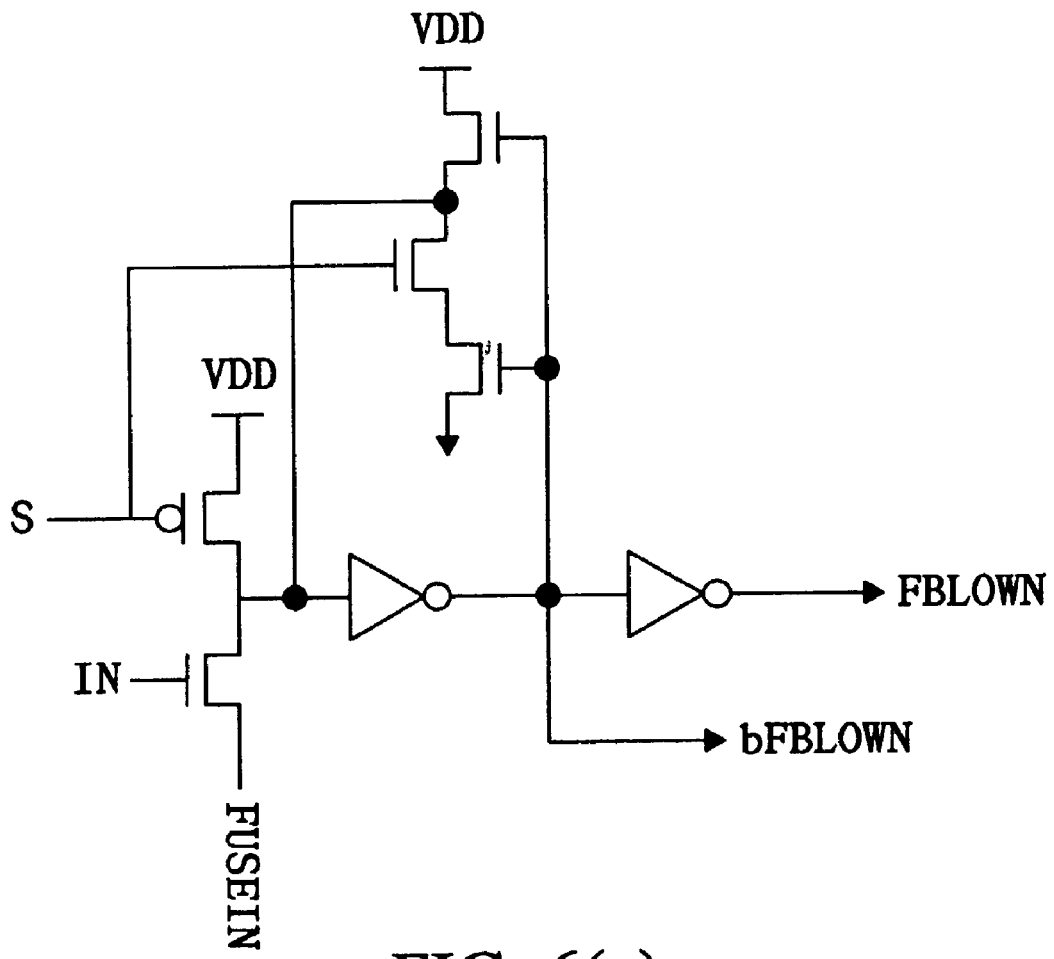
FIG. 6(a) shows an embodiment of the first logic circuit of FIG. 4(a)
Figure 6B:
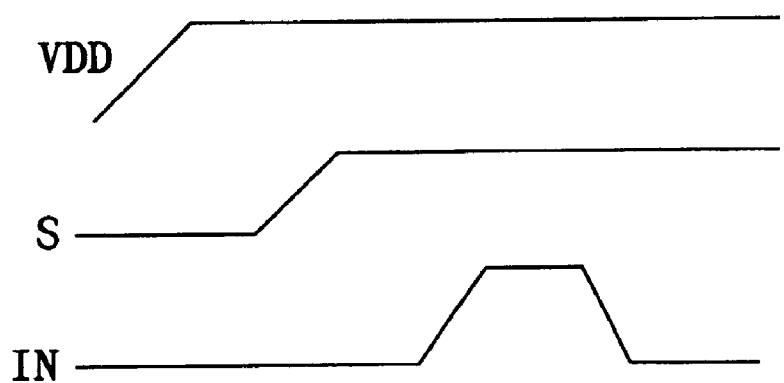
FIG. 6(b) shows a timing diagram of the structure in FIG. 6(a)

FIG. 6(a) shows an embodiment of the first logic circuit 41 of FIG. 4(a), and FIG. 6(b) shows a timing diagram of the structure in FIG. 6(a).

Figure 7:
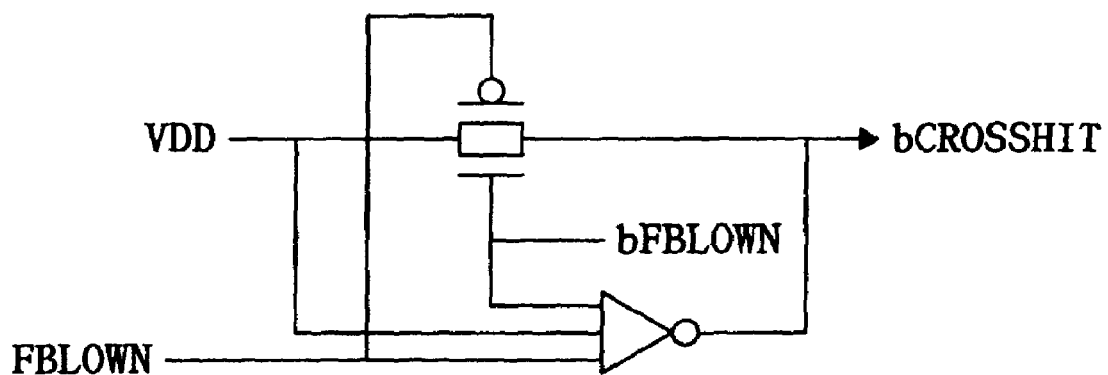
FIG. 7 shows an embodiment of the second logic circuit of FIG. 4(a).

FIG. 7 shows an embodiment of the second logic circuit 42 of FIG. 4(a).

The above-described embodiments of the present invention are intended to be illustrative only. Numerous alternative embodiments may be devised by those skilled in the art without departing from the scope of the following claims.

What is claimed is:

1. A short DC standby current erasion circuit of a DRAM, comprising:
   a block detection circuit for enabling a short circuit control signal when a short circuit between bit lines and word lines of said DRAM is detected, wherein a selection line input to said block detection circuit is set to one when a short circuit is detected and is set to zero when a short circuit is not detected; and
   a word line driving circuit connected to said block detection circuit, said word line driving circuit setting a voltage level of the word line occurring a short circuit as a voltage level of the corresponding bit line occurring a short circuit during substantially the entire duration of a standby mode if said short circuit control signal is enabled,
   wherein
   when the selection line is zero, an output signal of said block detection circuit is equal to an input signal of said block detection circuit, and
   when the selection line is one, said block detection circuit inverts the input signal to obtain the output signal, such that the output signal functions as the short circuit control signal.

2. The short DC standby current erasion circuit of claim 1, wherein said block detection circuit is a decoding circuit.

3. The short DC standby current erasion circuit of claim 2, wherein said block detection circuit comprises a fuse, a first logic circuit, and a second logic circuit.

4. The short DC standby current erasion circuit of claim 1, wherein said word line driving circuit is an inverter.

5. The short DC standby current erasion circuit of claim 1, wherein said word line driving circuit comprises a plurality of spare inverters.

6. A short DC standby current erasion circuit of a DRAM, comprising
   a plurality of word lines,
   a plurality of complementary bit lines,
   a plurality of pre-charge equalization circuits, and
   a plurality of word line driving circuits,
   wherein
   said word line driving circuits each include a block detection circuit which can detect whether a short circuit occurs between the plurality of word lines and the plurality of complementary bit lines and enable a short circuit control signal when a short circuit is detected,
   a selection line input to said block detection circuit is set to one when a short circuit is detected and is set to zero when a short circuit is not detected,
   said word line driving circuits set a voltage level of the word line occurring a short circuit as a voltage level of the corresponding bit line occurring a short circuit during substantially the entire duration of a standby mode for erasing a short DC standby current between the bit lines and the word lines when the short circuit control signal is enabled,
   when the selection line is zero, an output signal of said block detection circuit is equal to an input signal of said block detection circuit, and
   when the selection line is one, said block detection circuit inverts the input signal to obtain the output signal, such that the output signal functions as the short circuit control signal.

7. The short DC standby current erasion circuit of claim 6, wherein the plurality of word line driving circuits are inverter circuits.

8. A short DC standby current erasion circuit of a DRAM, comprising:
   a block detection circuit for enabling a short circuit control signal when a short circuit between bit lines and word lines of said DRAM is detected, wherein a selection line input to said block detection circuit is set to one when a short circuit is detected and is set to zero when a short circuit is not detected; and
   a word line driving circuit connected to said block detection circuit, said word line driving circuit setting a voltage level of the word line occurring a short circuit as a voltage level of the corresponding bit line occurring a short circuit during substantially the entire duration of a standby mode if said short circuit control signal is enabled,
   wherein
   when the selection line is zero, an output signal of said block detection circuit is equal to an input signal of said block detection circuit, and
   when the selection line is one, said block detection circuit inverts the input signal to obtain the output signal, such that the output signal functions as the short circuit control signal,
   and wherein said block detection circuit is a decoding circuit.

* * * * *